(12) United States Patent
Dong et al.

(10) Patent No.: US 11,309,560 B2
(45) Date of Patent: Apr. 19, 2022

(54) METHOD OF PREDICTING LIFE OF MEMBRANE ELECTRODE ASSEMBLY OF FUEL CELL FOR ELECTRIC POWER GENERATION

(71) Applicants: HYUNDAI MOTOR COMPANY, Seoul (KR); KIA MOTORS CORPORATION, Seoul (KR); KOREA INSTITUTE OF SCIENCE AND TECHNOLOGY, Seoul (KR)

(72) Inventors: Hyun Bae Dong, Yongin-si (KR); Min Kyung Cho, Seoul (KR); Won Jung Kim, Seoul (KR); Ju Hae Jung, Yongin-si (KR); Jong Hyun Jang, Seoul (KR); Hyun Seo Park, Seoul (KR); Myung Su Lim, Seoul (KR); Jun Young Kim, Seoul (KR)

(73) Assignees: HYUNDAI MOTOR COMPANY, Seoul (KR); KIA MOTORS CORPORATION, Seoul (KR); KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 265 days.

(21) Appl. No.: 16/824,898

(22) Filed: Mar. 20, 2020

(65) Prior Publication Data
US 2021/0013530 A1 Jan. 14, 2021

(30) Foreign Application Priority Data
Jul. 10, 2019 (KR) .................. 10-2019-0083283

(51) Int. Cl.
*G01R 31/392* (2019.01)
*H01M 8/04664* (2016.01)
*H01M 8/1004* (2016.01)
*G01R 31/367* (2019.01)
*H01M 8/04537* (2016.01)

(52) U.S. Cl.
CPC ...... *H01M 8/04671* (2013.01); *G01R 31/367* (2019.01); *G01R 31/392* (2019.01); *H01M 8/04582* (2013.01); *H01M 8/1004* (2013.01)

(58) Field of Classification Search
None
See application file for complete search history.

(56) References Cited

U.S. PATENT DOCUMENTS

2018/0292464 A1* 10/2018 Shinozaki ............ G01R 31/392

FOREIGN PATENT DOCUMENTS

KR 10-0647675 B1 11/2006

* cited by examiner

*Primary Examiner* — Jas A Sanghera
(74) *Attorney, Agent, or Firm* — Morgan, Lewis & Bockius LLP

(57) ABSTRACT

A method of predicting a life of a membrane electrode assembly (MEA) of a fuel cell for electric power generation includes: deriving an operating condition for accelerated degradation, which is applicable to the fuel cell; operating the fuel cell for a specific time under the derived operating condition for accelerated degradation and under a normal operating condition, and identifying the degree of degradation of the fuel cell under each of the operating conditions; calculating an acceleration multiple based on the degree of degradation identified under the operating condition for accelerated degradation and under the normal operating condition; and predicting the life of the membrane electrode assembly based on the acceleration multiple.

10 Claims, 9 Drawing Sheets

FIG. 3

|  | TEMPERATURE (°C) | RELATIVE HUMIDITY (%) (CC/OCV) | CROSSOVER TIME (MINUTES) (CC/OCV) | CURRENT DENSITY (A/cm$^2$) |
|---|---|---|---|---|
| CONDITION 1 | 90 | 50/50 | 60/60 | X |
| CONDITION 2 | 90 | 50/0 | 60/60 | |
| CONDITION 3 | 75 | 50/0 | 60/60 | |
| CONDITION 4 | 60 | 50/0 | 60/60 | |
| CONDITION 5 | 60 | 50/0 | 5/5 | |
| CONDITION 6 | 60 | 100/0 | 60/5 | |

… (1) METHOD OF PREDICTING LIFE OF MEMBRANE ELECTRODE ASSEMBLY OF FUEL CELL FOR ELECTRIC POWER GENERATION

CROSS REFERENCE TO RELATED APPLICATION

The present application claims the benefit of priority to Korean Patent Application No. 10-2019-0083283, filed on Jul. 10, 2019 in the Korean Intellectual Property Office, the entire contents of which is incorporated herein by reference.

TECHNICAL FIELD

The present disclosure relates to a method of predicting a life of a membrane electrode assembly (MEA) of a fuel cell for electric power generation and, more particularly, to a method of predicting a life of a membrane electrode assembly of a fuel cell for electric power generation using an operating condition for accelerated degradation, which is applicable to the fuel cell.

BACKGROUND

Generally, a fuel cell is a device that generates electric energy by causing hydrogen ($H_2$) and oxygen ($O_2$) to react with each other. The fuel cell includes a membrane electrode assembly (MEA). The membrane electrode assembly is configured to include an electrolyte membrane to which a hydrogen ion (H) is transferred, an anode that is configured to be stacked on one side of the electrolyte membrane in order to be provided with fuel, that is, oxygen ($H_2$), and a cathode that is configured to be stacked on the other side of the electrolyte in order to be provided with air (oxygen). A stack of the fuel cell results from sequentially stacking the membrane electrode assembly and a separation plate on top of another.

The biggest problem to be overcome to commercialize a polymer electrolyte membrane fuel cell (PEMFC) configured to have this stack is its high price and short life.

For this reason, evaluation of durability of the polymer electrolyte membrane is indispensable for its life-long operation. Particularly, the evaluation of durability of a new-developed electrolyte membrane and the tests of whether electrolyte membranes purchased in large quantities have durability are very important.

On the other hand, much progress has been made in a study on accelerated-degradation operation for evaluation of the durability of a vehicle fuel cell, but a study on accelerated-degradation operation for evaluation of the durability of the fuel cell for electric power generation has not yet conducted. The verification of the life expectancy (durability) or the like of the membrane electrode assembly of the fuel cell requires a considerable amount of time and effort. Accordingly, it is necessary to develop a technology in which the life expectancy of the membrane electrode assembly can be estimated on the basis of an operating condition for accelerated degradation, which is applicable to the fuel cell.

The above information disclosed in this Background section is only for enhancement of understanding of the background of the present disclosure, and should not be taken as acknowledgement that this information forms the prior art that is already known to a person skilled in the art.

SUMMARY

An object of the present disclosure is to provide a method of deriving an operating condition for accelerated degradation, which is applicable to a fuel cell for electric power generation, and of predicting a life of a membrane electrode assembly of the fuel cell using the derived operating condition for accelerated degradation.

According to an aspect of the present disclosure, a method of predicting a life of a membrane electrode assembly of a fuel cell for electric power generation includes: deriving an operating condition for accelerated degradation, which is applicable to the fuel cell; operating the fuel cell for a specific time under the derived operating condition for accelerated degradation and under a normal operating condition, and then identifying a degree of degradation of the fuel cell and a tendency for the degree of degradation thereof under each of the operating conditions; calculating an acceleration multiple based on the degree of degradation identified under the operating condition for accelerated degradation and under the normal operating condition; and predicting the life of the membrane electrode assembly based on the acceleration multiple.

In the method, the deriving an operating condition for accelerated degradation may include applying a specific electric current to the fuel cell, but repeatedly operating the fuel cell at a specific time interval while changing relative-humidity conditions of an anode and a cathode of the fuel cell and a temperature condition of the fuel cell, and identifying the degree of degradation and the tendency for the degree of degradation under each of the conditions, checking whether or not the identified degree of degradation under each of the conditions falls within a predetermined range of degrees of degradation and comparing the identified tendency of the degree of degradation with a tendency for the degree of degradation, which is identified after operating the fuel cell under a normal operating condition, and selecting a condition under which the identified degree of degradation under each of the condition falls within the predetermined range of the degrees of degradation and under which the tendency of the degree of degradation is the same as the tendency for the degree of degradation, which is identified under the normal operating condition.

In the method, the degree of degradation and the tendency for the degree of degradation may indicate which one of components of the fuel cell including a catalyst, a membrane, and a gas diffusion layer (GDL) is degraded most.

In the method, in the operating the fuel battery for a specific time under the derived operating condition for accelerated degradation and under a normal operating condition, and then the identifying of a degree of degradation of the fuel battery and a tendency for the degree of degradation thereof under each of the operating conditions, the degree of degradation and the tendency of the degree of degradation may be identified based on at least one of an open circuit voltage (OCV) analysis, a voltage density analysis, an electric current density analysis, an Ohmic analysis, a crossover analysis, or an electrochemical surface area (ECSA) analysis.

In the method, the calculating an acceleration multiple based on the degree of degradation identified under the operating condition for accelerated degradation and under the normal operating condition may include calculating an accelerated-degradation speed under the operating condition for accelerated degradation, based on the identified degree of degradation under the operating condition for accelerated degradation, calculating a normal degradation speed under the normal operating condition, based on the identified degree of degradation under the normal operating condition, and calculating the acceleration multiple by dividing the accelerated-degradation speed by the normal degradation speed.

In the method, the accelerated-degradation speed and the normal degradation speed may indicate a slope of a graph that is obtained by matching a voltage value on a time basis with the same electric current density as a reference after operating the fuel cell on a time basis under the normal operating condition and under the operating condition for accelerated degradation.

In the method, the acceleration multiple may indicate how many more times the fuel cell is degraded when operated under the operating condition for accelerated degradation than when operated under the normal operating condition.

In the method, the predicting the life of the membrane electrode assembly based on the acceleration multiple may include deriving the time it takes for performance of the fuel cell to be decreased by a predetermined percentage from initial performance when operating the fuel cell under the operating condition for accelerated degradation, and predicting the life of the membrane assembly by multiplying the derived time and the acceleration multiple.

The method may further including deriving an optimal condition for an electric current that is to be applied to the fuel cell such that the fuel cell has optimal durability, based on the derived operating condition for accelerated degradation, which is applicable to the fuel cell.

In the method, the deriving an optimal condition for an electric current that is to be applied to the fuel cell may include fixing the relative humidity conditions of the anode and the cathode of the fuel cell and the temperature condition of the fuel cell, among the derived operating conditions for accelerated degradation, operating the fuel cell by applying multiple different electric currents to the fuel cell, and identifying the degree of degradation of the fuel cell under a condition for each of the multiple electric currents, and selecting as an optimal condition for an electric current a condition for an electric current under which the degree of degradation of the fuel cell is lowest.

According to the present disclosure, the operating condition for accelerated degree of degradation, which is applicable to the fuel cell, can be derived, and the life of the membrane electrode assembly of the fuel battery can be easily predicted using the derived operating condition for accelerated degradation.

BRIEF DESCRIPTION OF THE DRAWINGS

The above and other objects, features and other advantages of the present disclosure will be more clearly understood from the following detailed description when taken in conjunction with the accompanying drawings, in which:

FIG. 3 is a table illustrating operating conditions for deriving operating conditions for accelerated degradation, which are applicable to the fuel cell for electric power generation, in the method of predicting the life of the membrane electrode assembly of the fuel cell for electric power generation according to an exemplary embodiment of the present disclosure;

DETAILED DESCRIPTION

Figure 1:
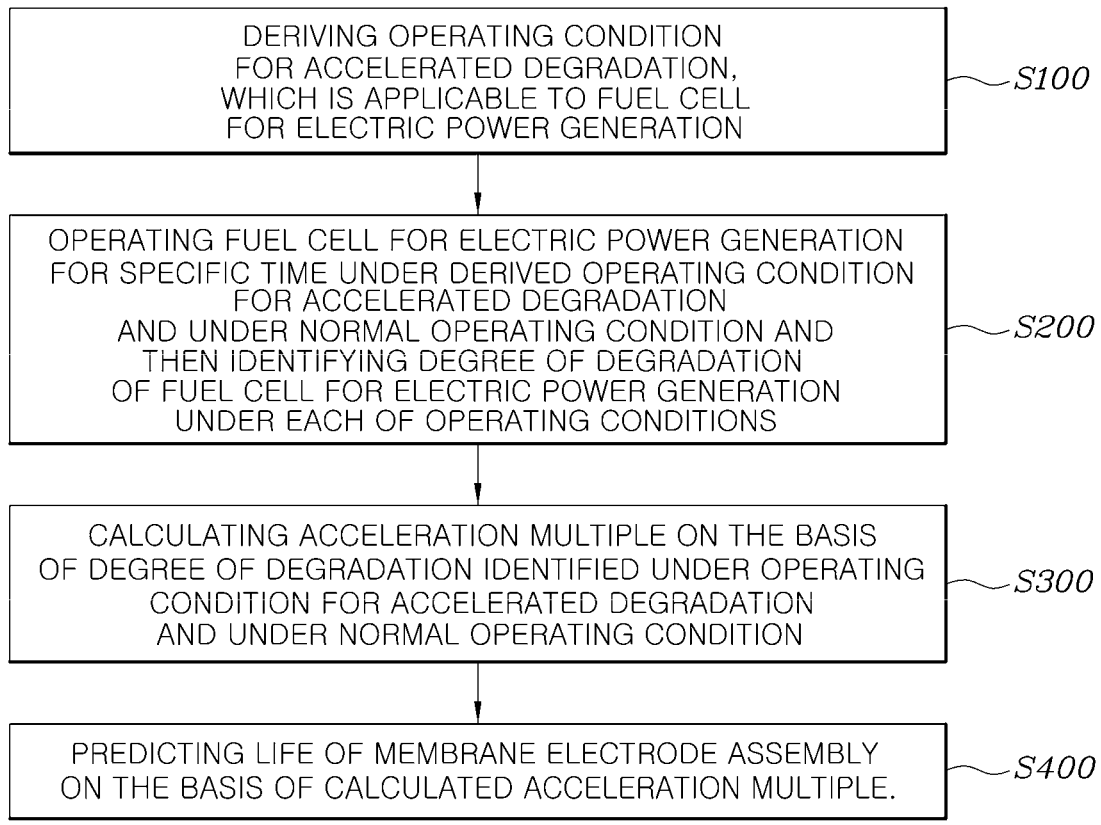
FIG. 1 is a diagram illustrating a flow for performing a method of predicting a life of a membrane electrode assembly of a fuel cell for electric power generation according to an exemplary embodiment of the present disclosure.
Figure 2:
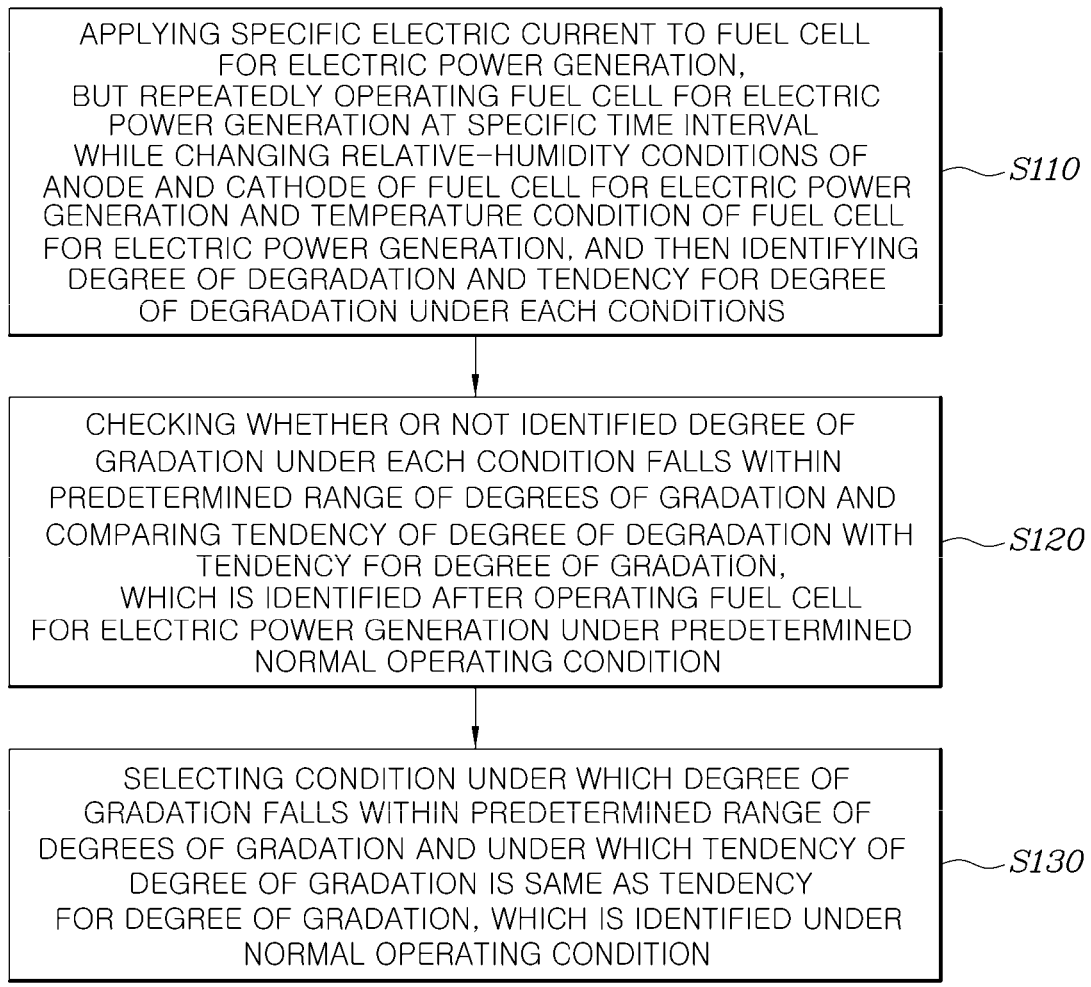
FIG. 2 is a flowchart illustrating steps of deriving an operating condition for accelerated degradation, which is applicable to the fuel cell for electric power generation, in the method of predicting the life of the membrane electrode assembly of the fuel cell for electric power generation according to an exemplary embodiment of the present disclosure.
Figure 4:
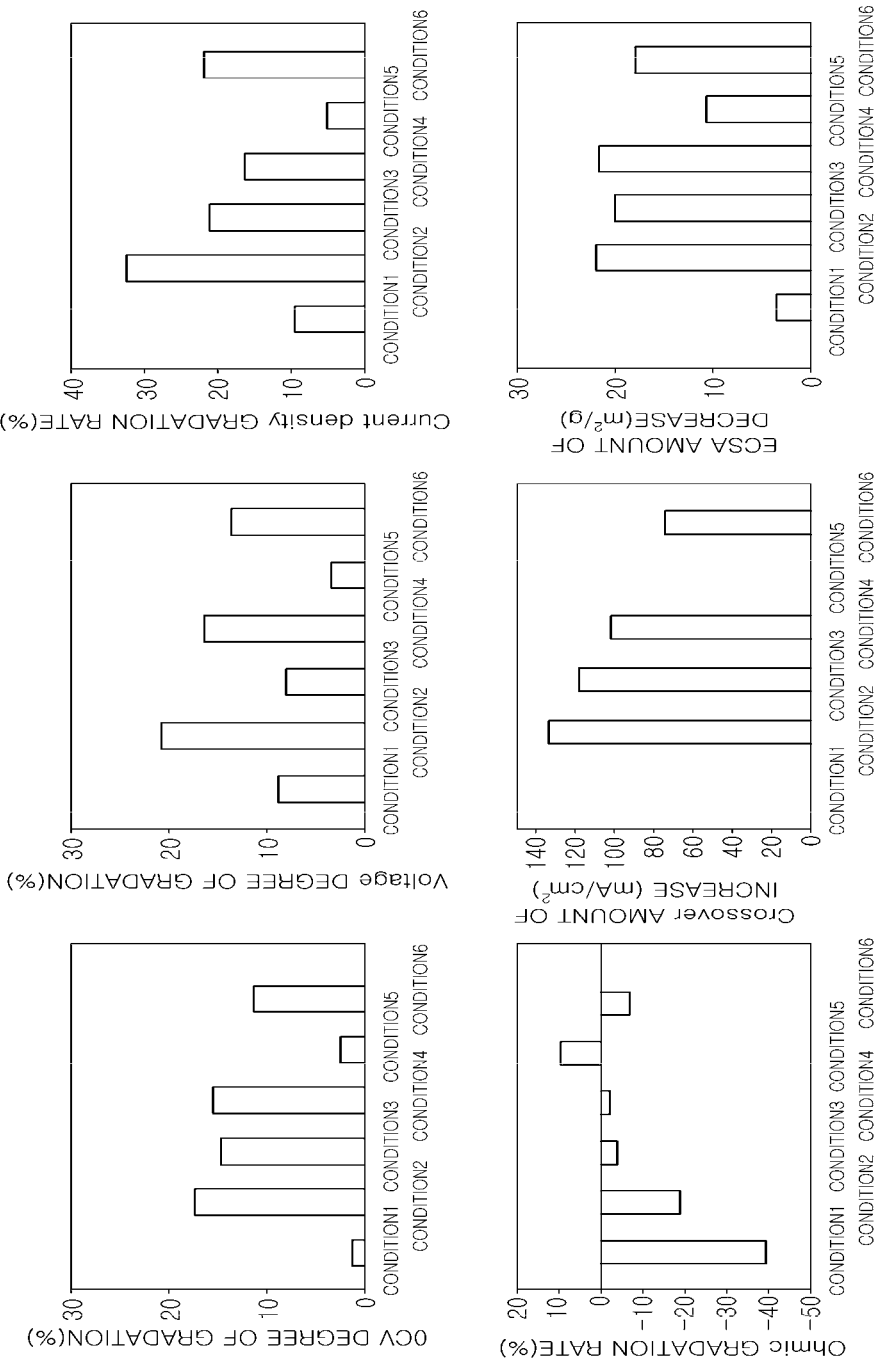
FIG. 4 is a diagram illustrating a result of analysis of a degree of degradation under each of the conditions in FIG. 3.
Figure 5:
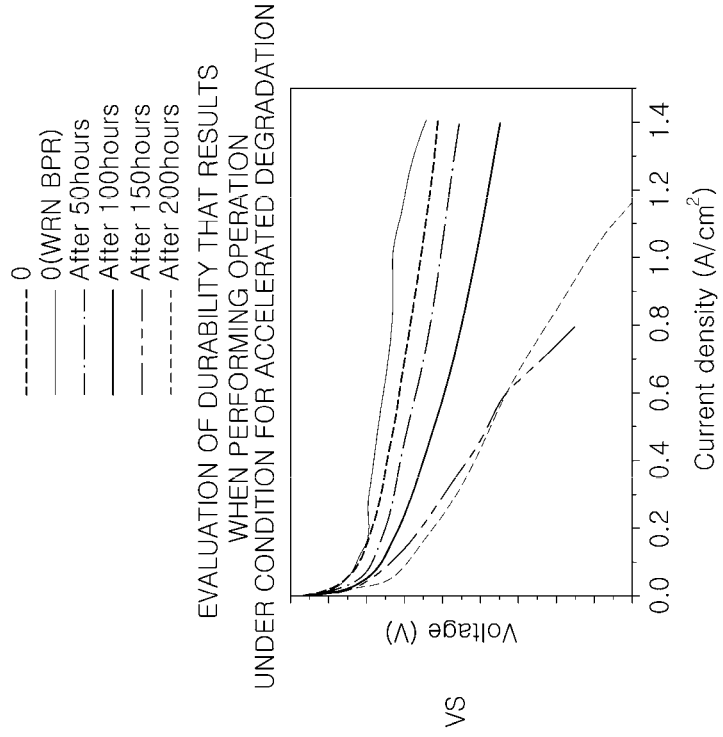
FIG. 5 is a diagram illustrating durability that results from operating on a time basis under a normal operating condition and durability that results from operating on a time basis under the operating condition for accelerated degradation, in the method of predicting the life of the membrane electrode assembly of the fuel cell for electric power generation according to an exemplary embodiment of the present disclosure.
Figure 6:
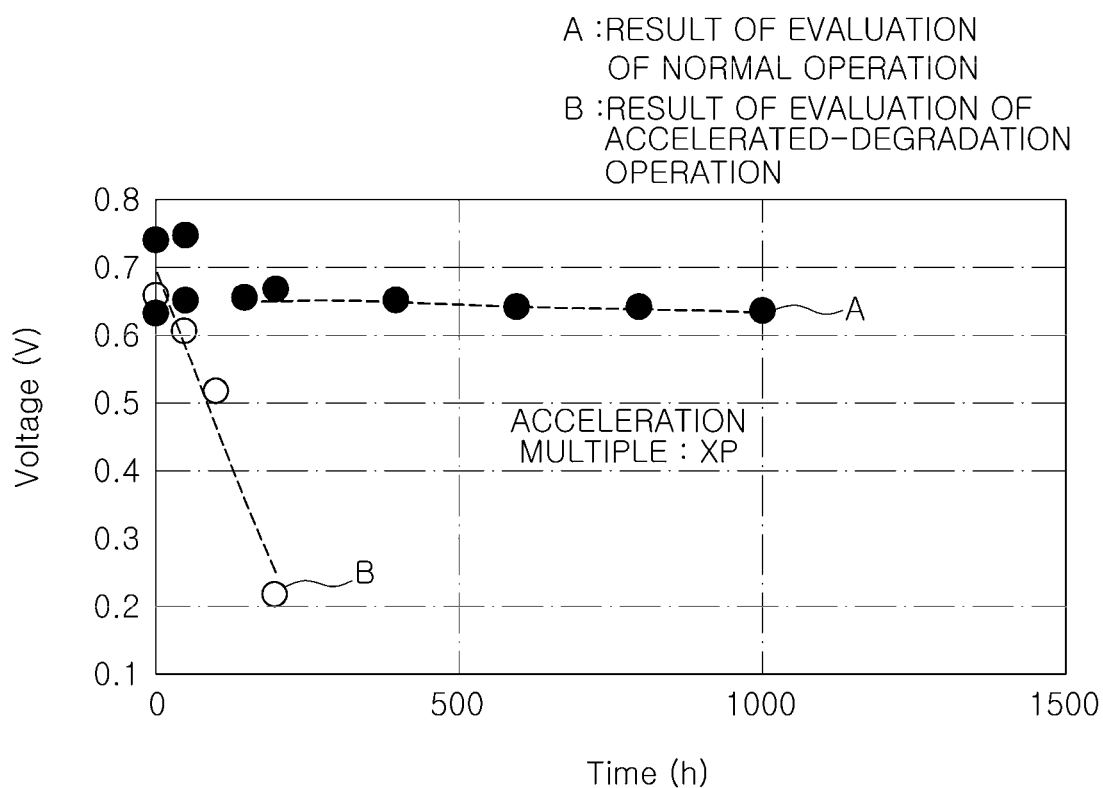
FIG. 6 is a diagram illustrating an accelerated-degradation speed under an accelerated operating condition and a degradation speed under the normal operating condition, in the method of predicting the life of the membrane electrode assembly of the fuel cell for electric power generation according to an exemplary embodiment of the present disclosure.
Figure 7:
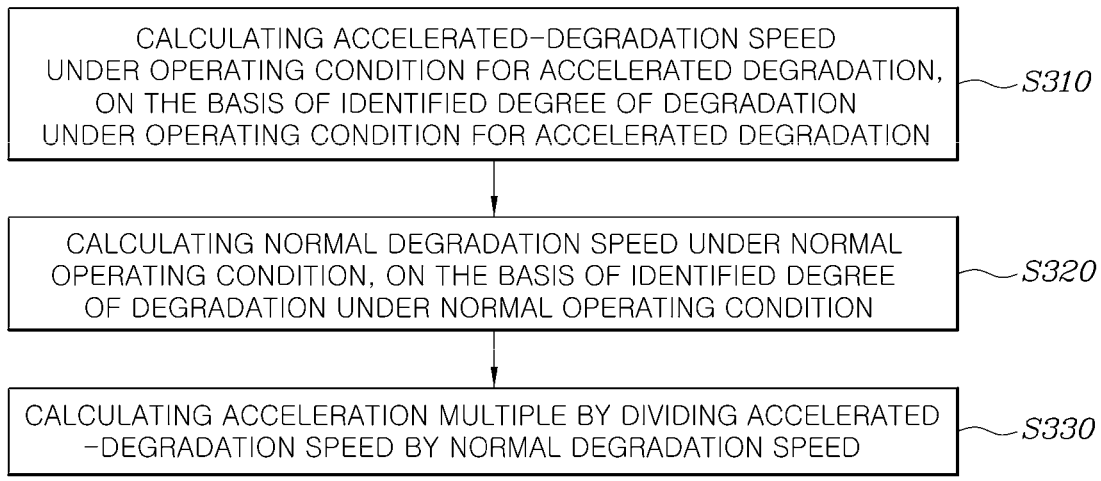
FIG. 7 is a diagram illustrating steps of calculating an acceleration multiple, in the method of predicting the life of the membrane electrode assembly of the fuel cell for electric power generation according to an exemplary embodiment of the present disclosure.
Figure 8:
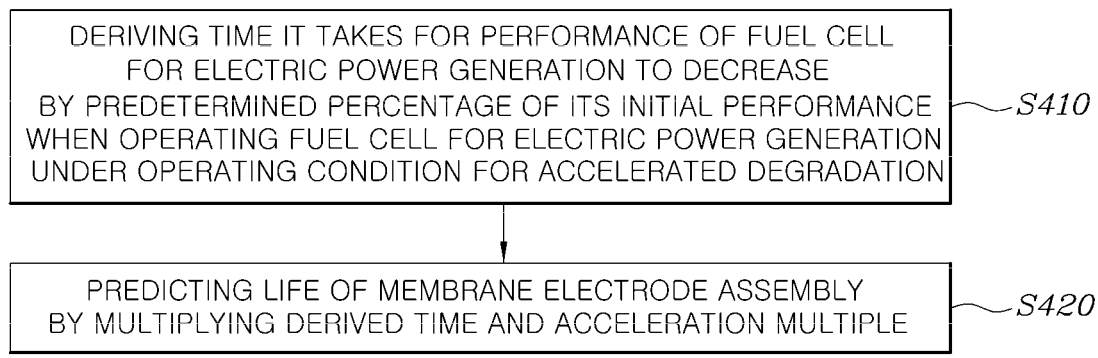
FIG. 8 is a diagram illustrating steps of predicting the life of the membrane electrode assembly based on the acceleration multiple, in the method of predicting the life of the membrane electrode assembly of the fuel cell for electric power generation according to an exemplary embodiment of the present disclosure.
Figure 9:
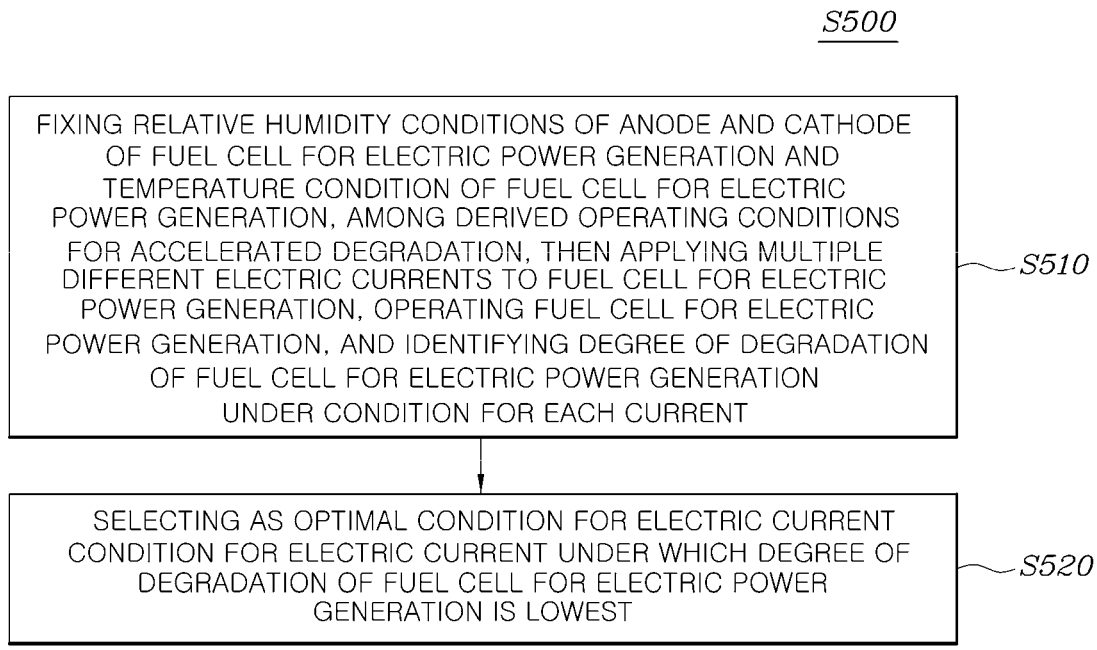
FIG. 9 is a diagram illustrating steps of determining the effectiveness of the derived operating condition for accelerated degradation, in the method of predicting the life of the membrane electrode assembly of the fuel cell for electric power generation according to an exemplary embodiment of the present disclosure.

A method of predicting a life of a membrane electrode assembly of a fuel cell for electric power generation according to an embodiment of the present disclosure will be described in detail below with referring to the accompanying drawings. FIG. 1 is a diagram illustrating a flow for performing the method of predicting the life of the membrane electrode assembly of the fuel cell for electric power generation according to an exemplary embodiment of the present disclosure. FIG. 2 is a flowchart illustrating steps of deriving an operating condition for accelerated degradation, which is applicable to the fuel cell for electric power generation. FIG. 3 is a table illustrating operating conditions for deriving operating conditions for accelerated degradation, which are applicable to the fuel cell for electric power generation. FIG. 4 is a diagram illustrating a result of analysis of a degree of degradation under each of the conditions in FIG. 3. FIG. 5 is a diagram illustrating durability that results from operating on a time basis under a normal operating condition and durability that results from operating on a time basis under the operating condition for accelerated degradation. FIG. 6 is a diagram illustrating an accelerated-degradation speed under an accelerated operating condition and a degradation speed under the normal operating condition. FIG. 7 is a diagram illustrating steps of calculating an acceleration multiple. FIG. 8 is a diagram illustrating steps of predicting the life of the membrane electrode assembly based on the acceleration multiple. FIG. 9 is a diagram illustrating steps of determining the effectiveness of the derived operating condition for accelerated degradation.

As illustrated in FIG. 1, a method of predicting a life of a membrane electrode assembly of a fuel cell for electric power generation according to an exemplary embodiment of the present disclosure includes Step S100 of deriving an operating condition for accelerated degradation, which is applicable to the fuel cell, Step S200 of operating the fuel cell for a specific time under the derived operating condition for accelerated degradation and under the normal operating condition and then identifying a degree of degradation of the fuel cell under each of the operating conditions, Step S300 of calculating an acceleration multiple based on the degree of degradation identified under the derived operating condition for accelerated degradation and under the normal operating condition, and Step S400 of predicting the life of the membrane electrode assembly based on the calculated acceleration multiple.

Specifically, Step S100 of deriving an operating condition for accelerated degradation, which is applicable to the fuel cell, as illustrated in FIG. 2, includes Step S110 of applying a specific electric current to the fuel cell, but of repeatedly operating the fuel cell at a specific time interval while changing relative-humidity conditions of an anode and a cathode of the fuel cell and a temperature condition of the fuel cell, and then of identifying the degree of degradation and a tendency for the degree of degradation under each of the conditions, Step S120 of checking whether or not the identified degree of degradation under each of the conditions falls within a predetermined range of degrees of degradation and of comparing the tendency of the degree of degradation with a tendency for the degree of degradation, which is identified after operating the fuel cell under a normal operating condition, and Step S130 of selecting a condition under which the degree of degradation falls within the predetermined range of the degrees of degradation and under which the tendency of the degree of degradation is the same as the tendency for the degree of degradation, which is identified under the normal operating condition, from among the identified degrees of degradation.

More specifically, according to an exemplary embodiment, as illustrated in FIG. 3, the fuel cell is repeatedly operated at a specific time interval under six different conditions and then the degree of degradation and the tendency for the degree of degradation under each of the conditions are identified in FIG. 4, in the step of applying a specific electric current to the fuel cell, but of repeatedly operating the fuel cell at a specific time interval while changing relative-humidity conditions of an anode and a cathode of the fuel cell and a temperature condition of the fuel cell, and then of identifying the degree of degradation and the tendency for the degree of degradation under each of the conditions.

Steps of identifying the degree of degradation and the tendency for the degree of degradation under each of the conditions (Condition 1 to Condition 6) are described as follows with reference to FIGS. 3 and 4.

1. Condition 1

1-1. In a state where a stack of the fuel cell is raised up by 90 degrees, hydrogen and oxygen are supplied to an anode and a cathode, respectively, at a relative humidity of 50%, an electric current of X A/cm$^2$ is applied to the fuel cell, and the fuel cell is operated for 60 minutes.

1-2. After 60 minutes, the application of the electric current to the fuel cell is stopped and thus an open circuit voltage (OCV) state is entered. In this state, hydrogen and oxygen are supplied to the anode and the cathode, respectively, at a relative humidity of 50%, and the fuel cell is operated for 60 minutes.

1-3. The operations 1-1 and 1-2 are performed repeatedly, and the degree of degradation and the tendency for the degree of degradation are identified at an interval of 100 hours through performance analysis.

2. Condition 2

2-1. In the state where the stack of the fuel cell is raised up by 90 degrees, hydrogen and oxygen are supplied to the anode and the cathode, respectively, at a relative humidity of 50%, the electric current of X A/cm$^2$ is applied to the fuel cell, and the fuel cell is operated for 60 minutes.

2-2. After 60 minutes, the application of the electric current to the fuel cell is stopped and thus the open circuit voltage (OCV) state is entered. In this state, hydrogen and oxygen are supplied to the anode and the cathode, respectively, at a humidity of 0%, and the fuel cell is operated for 60 minutes.

2-3. The operations 2-1 and 2-2 are performed repeatedly, and the degree of degradation and the tendency for the degree of degradation are identified at an interval of 100 hours through the performance analysis.

3. Condition 3

3-1. In a state where the stack of the fuel cell is raised up by 75 degrees, hydrogen and oxygen are supplied to the anode and the cathode, respectively, at a relative humidity of 50%, the electric current of X A/cm$^2$ is applied to the fuel cell, and the fuel cell is operated for 60 minutes.

3-2. After 60 minutes, the application of the electric current to the fuel cell is stopped and thus the open circuit voltage (OCV) state is entered. In this state, hydrogen and oxygen are supplied to the anode and the cathode, respectively, at a humidity of 0%, and the fuel cell is operated for 60 minutes.

3-3. The operations 3-1 and 3-2 are performed repeatedly, and the degree of degradation and the tendency for the degree of degradation are identified at an interval of 100 hours through the performance analysis.

4. Condition 4

4-1. In a state where the stack of the fuel cell is raised up by 60 degrees, hydrogen and oxygen are supplied to the anode and the cathode, respectively, at a relative humidity of 50%, the electric current of X A/cm$^2$ is applied to the fuel cell, and the fuel cell is operated for 60 minutes.

4-2. After 60 minutes, the application of the electric current to the fuel cell is stopped and thus the open circuit voltage (OCV) state is entered. In this state, hydrogen and oxygen are supplied to the anode and the cathode, respectively, at a humidity of 0%, and the fuel cell is operated for 60 minutes.

4-3. The operations 4-1 and 4-2 are performed repeatedly, and the degree of degradation and the tendency for the degree of degradation are identified at an interval of 100 hours through the performance analysis.

5. Condition 5

5-1. In the state where a stack of the fuel cell is raised up by 60 degrees, hydrogen and oxygen are supplied to the anode and the cathode, respectively, at a relative humidity of 50%, the electric current of X A/cm$^2$ is applied to the fuel cell, and the fuel cell is operated for 5 minutes.

5-2. After 5 minutes, the application of the electric current to the fuel cell is stopped and thus the open circuit voltage (OCV) state is entered. In this state, hydrogen and oxygen are supplied to the anode and the cathode, respectively, at a humidity of 0%, and the fuel cell is operated for 5 minutes.

5-3. The operations 5-1 and 5-2 are performed repeatedly, and the degree of degradation and the tendency for the degree of degradation are identified at an interval of 100 hours through the performance analysis.

6. Condition 6

6-1. In the state where the stack of the fuel cell is raised up by 60 degrees, hydrogen and oxygen are supplied to the anode and the cathode, respectively, at a relative humidity of 100%, the electric current of X A/cm$^2$ is applied to the fuel cell, and the fuel cell is operated for 60 minutes.

6-2. After 60 minutes, the application of the electric current to the fuel cell is stopped and thus the open circuit voltage (OCV) state is entered. In this state, hydrogen and oxygen are supplied to the anode and the cathode, respectively, at a humidity of 0%, and the fuel cell is operated for 5 minutes.

6-3. The operations 6-1 and 6-2 are performed repeatedly, and the degree of degradation and the tendency for the degree of degradation are identified at an interval of 100 hours through the performance analysis.

Under Condition 1 to Condition 6, a value of X in the electric current of X A/cm$^2$ that is applied to the fuel cell ranges 0 to 1.5.

Under Conditions 1 to Conditions 6, the fuel cell is operated, and then, as illustrated in FIG. 4, the degree of degradation and the tendency for the degree of degradation under each of the conditions can be identified. At this point, the degree of degradation and the tendency of the degree of degradation indicate which one of components, such as a catalyst, a membrane, and a gas diffusion layer (GDL), that are included in the fuel cell is degraded much more.

In addition, the degree of degradation and the tendency of the degree of degradation, as illustrated in FIG. 4, can be identified based on at least one or more of an open circuit voltage (OCV) analysis, a voltage density analysis, an electric current density analysis, an Ohmic analysis, a crossover analysis, and an electrochemical surface area (ECSA) analysis. The OCV analysis identifies how much the membrane is damaged. The voltage density analysis and the electric current density analysis identify how much performance of all stacks of the fuel cell decrease. The Ohmic analysis identifies how much resistance of the stack of the fuel cell is increased. The crossover analysis identifies how much the membrane permits hydrogen to pass through. The ECSA analysis identifies how much an activation area of the catalyst is reduced. The degree of degradation of the fuel cell is identified with a result of each of these analyses.

According to the present disclosure, the degree of degradation and the tendency for the degree under Condition 1 to Condition 6 are identified as described above. Subsequently, it is checked whether or not the identified degree of degradation under each of the conditions falls within a predetermined range of degrees of degradation, and the tendency of the degree of degradation is compared with the tendency for the degree of degradation that is identified after operating the fuel cell. Thereafter, a condition under which the degree of degradation that is identified under Condition 1 to Condition 6 falls within the predetermined range of the degrees of degradation and under which the tendency of the degree of degradation is the same as the tendency for the degree of degradation, which is identified under the normal operating condition is selected as the operating condition for accelerated degradation, which is applicable to the fuel cell.

According to an exemplary embodiment, the predetermined range of the degrees of degradation is a range of degrees of degradation in which performance of the stack of the fuel cell decreases by 5% to 20% of its initial performance with a voltage of the stack of the fuel cell as a reference. At this point, a point in time when the performance decreases by 20% of the initial performance with the voltage of the stack of the fuel cell as a reference means a point in time when the operating of a relevant fuel cell system has to be finished. Furthermore, a point in time when the performance decreases by 5% of the initial performance with the voltage of the stack of the fuel cell as a reference means an initial point in time when the degree of degradation of a constituent element within a relevant stack of the fuel cell can be identified.

In other words, under which condition of Condition 1 to Condition 6 the performance decreases by 5% to 20% of the initial performance with the voltage of the stack of the fuel cell as a reference is identified, and under which condition the tendency for the degree of degradation is consistent with a condition for the tendency for the degree degradation, which is identified after operating the fuel cell under a normal condition, is identified. Thus, the resulting condition is selected as the operating condition for accelerated degradation, which is applicable to the fuel cell.

On the other hand, in Step S200 of operating the fuel cell for a specific time under the derived operating condition for accelerated degradation and under the normal operating condition and then identifying a degree of degradation of the fuel cell under each of the operating conditions, the fuel cell may be operated for a specific time under the operating condition for accelerated degradation, which is derived in Step S100, and under a normal operating condition, and then the degree of degradation of the fuel cell and the tendency for the degree of degradation thereof under each of the operating conditions can be identified as illustrated in FIG. 5. Specifically, FIG. 5 is a graph showing a voltage of the stack of the fuel cell under each of the operating conditions, with respect to an electric current density that results from operating the fuel cell for the specific time under the operating condition for accelerated degradation and the normal operating condition. With reference to FIG. 5, a rate of decrease in performance, that is, the degree of degradation and the tendency for the degree of degradation, under each of the operating conditions, can be identified through a rate of decrease in the voltage of the stack of the fuel cell.

In addition, Step S300 of calculating an acceleration multiple based on the degree of degradation that is identified under the operating condition for accelerated degradation and under the normal operating condition in Step S200 may include Step S310 of calculating the accelerated-degradation speed under the operating condition for accelerated degradation, based on the identified degree of degradation under the operating condition for accelerated degradation, Step S320 of calculating a normal degradation speed under the normal operating condition, based on the degree of degradation under the derived normal operating condition, and Step S330 of calculating the acceleration multiple by dividing the accelerated-degradation speed by the normal degradation speed.

More specifically, in order to calculate the accelerated-degradation speed and the normal degradation speed, a graph as in FIG. 6 is obtained by matching a voltage value on a time basis on the graph in FIG. 5 with the same electric current density as a reference. In addition, with reference to FIG. 6, a slope of Graph A means the normal degradation speed, and a slope of Graph B is the accelerated-degradation speed.

With the method described above, the accelerated-degradation speed and the normal degradation speed are calculated, and then the acceleration multiple is calculated by dividing the accelerated-degradation speed by the normal degradation speed.

At this point, the acceleration multiple indicates how many more times the fuel cell is degraded when operated under the operating condition for accelerated degradation than when operated under the normal operating condition.

On the other hand, Step S400 of predicting the life of the membrane electrode assembly based on the acceleration multiple may include Step S410 of deriving the time it takes for performance of the fuel cell to decrease by a predetermined percentage of its initial performance when operating the fuel cell under the operating condition for accelerated degradation, and Step S420 of predicting the life of the membrane electrode assembly by multiplying the derived time and the acceleration multiple.

According to an exemplary embodiment, when the acceleration multiple calculated in Step S300 is 20 and the time it takes for performance of the membrane electrode assembly of the fuel cell to decrease by 20% of its initial performance is 1,000 hours, in a case where the fuel cell is operated under the normal operating condition, a life expectancy of the membrane electrode assembly of the fuel cell is 20,000 hours, which results from multiplying 1,000 hours by 20. At this point, a point in time when the fuel cell decreases by 20% of its initial performance means a point in time when the operating of the fuel cell has to be finished. In this manner, according to the present disclosure, the operating condition for accelerated degradation, which is applicable to the fuel cell, can be derived, and the life of the membrane electrode assembly of the fuel cell can be easily predicted using the derived operating condition for accelerated degradation.

On the other hand, the method of predicting a life of a membrane electrode assembly of a fuel cell according to an exemplary embodiment of the present disclosure may further include Step S500 of deriving an optimal condition for an electric current that is to be applied to the fuel cell such that the fuel cell has optimal durability, with the derived operating condition for accelerated degradation, which is applicable to the fuel cell, as a reference, subsequently to the step of deriving the operating condition for accelerated degradation, which is applicable to the fuel cell.

Specifically, the step of deriving the optimal condition for the electric current that is to be applied to the fuel cell may include Step S510 of fixing relative humidity conditions of the anode and the cathode of the fuel cell, and a temperature condition of the fuel cell, among the derived operating conditions for accelerated degradation, then of applying multiple different electric currents to the fuel cell, of operating the fuel cell, and of identifying the degree of degradation of the fuel cell under a condition for each of the multiple electric currents, and Step S520 of selecting as an optimal condition for an electric current a condition for an electric current under which the degree of degradation of the fuel cell is lowest.

More specifically, according to an exemplary embodiment, the relative humidity conditions of the anode and the cathode of the fuel cell and the temperature condition of the fuel cell, among the derived operating conditions for accelerated degradation, are fixed. Thereafter, different electric currents, that is, an electric current of 0.2 A/cm², an electric current of 0.5 A/cm², and an electric current of 1.0 A/cm² are applied to the fuel cell, the fuel cell is operated, the degree of degradation of the fuel cell and the tendency for the degree of degradation thereof under a condition for each of the electric currents are identified, and a condition under which the degree of degradation is lowest is selected as an optimal condition for an electric current.

According to an exemplary embodiment of the present disclosure, the above described steps for the method of predicting a life of an MEA of a fuel cell for electric power generation may be performed by a processor (e.g., computer, microprocessor, CPU, ASIC, circuitry, logic circuits, etc.) having an associated non-transitory memory storing software instructions for the processor.

What is claimed is:

1. A method of predicting a life of a membrane electrode assembly (MEA) of a fuel cell for electric power generation, the method comprising:
   deriving an operating condition for accelerated degradation, which is applicable to the fuel cell;
   operating the fuel cell for a specific time under the derived operating condition for accelerated degradation and under a normal operating condition, and then identifying a degree of degradation of the fuel cell and a tendency for the degree of degradation thereof under each of the operating conditions;
   calculating an acceleration multiple based on the degree of degradation identified under the derived operating condition for accelerated degradation and under the normal operating condition; and
   predicting the life of the membrane electrode assembly based on the acceleration multiple.

2. The method according to claim 1, wherein the deriving an operating condition for accelerated degradation includes:
   applying a specific electric current to the fuel cell, but repeatedly operating the fuel cell at a specific time interval while changing relative-humidity conditions of an anode and a cathode of the fuel cell and a temperature condition of the fuel cell, and identifying the degree of degradation and the tendency for the degree of degradation under each of the relative-humidity and temperature conditions;
   checking whether or not the identified degree of degradation under each of the relative-humidity and temperature conditions falls within a predetermined range of degrees of degradation, and comparing the identified tendency of the degree of degradation with a tendency for the degree of degradation which is identified after operating the fuel cell under a normal operating condition; and
   selecting a condition under which the identified degree of degradation under each of the relative-humidity and temperature conditions falls within the predetermined range of the degrees of degradation and under which the tendency of the degree of degradation is the same as the tendency for the degree of degradation identified under the normal operating condition.

3. The method according to claim 2, wherein the degree of degradation and the tendency for the degree of degradation indicate which one of components of the fuel cell including a catalyst, a membrane, and a gas diffusion layer (GDL) is degraded most.

4. The method according to claim 1, wherein, in the operating the fuel cell for a specific time under the derived operating condition for accelerated degradation and under a normal operating condition, and then the identifying of a degree of degradation of the fuel cell and a tendency for the degree of degradation thereof under each of the operating conditions, the degree of degradation and the tendency of the degree of degradation are identified based on at least one of an open circuit voltage (OCV) analysis, a voltage density analysis, an electric current density analysis, an Ohmic analysis, a crossover analysis, or an electrochemical surface area (ECSA) analysis.

5. The method according to claim 1, wherein the calculating an acceleration multiple based on the degree of degradation identified under the derived operating condition for accelerated degradation and under the normal operating condition includes:
calculating an accelerated-degradation speed under the derived operating condition for accelerated degradation, based on the identified degree of degradation under the derived operating condition for accelerated degradation;
calculating a normal degradation speed under the normal operating condition, based on the identified degree of degradation under the normal operating condition; and
calculating the acceleration multiple by dividing the accelerated-degradation speed by the normal degradation speed.

6. The method according to claim 5, wherein the accelerated-degradation speed and the normal degradation speed indicate a slope of a graph that is obtained by matching a voltage value on a time basis with the same electric current density as a reference after operating the fuel cell on a time basis under the normal operating condition and under the derived operating condition for accelerated degradation.

7. The method according to claim 1, wherein the acceleration multiple indicates how many more times the fuel cell is degraded when operated under the derived operating condition for accelerated degradation than when operated under the normal operating condition.

8. The method according to claim 1, wherein the predicting the life of the membrane electrode assembly based on the acceleration multiple includes:
deriving the time it takes for performance of the fuel cell to be decreased by a predetermined percentage from initial performance when operating the fuel cell under the derived operating condition for accelerated degradation; and
predicting the life of the membrane assembly by multiplying the derived time and the acceleration multiple.

9. The method according to claim 1, further comprising:
deriving an optimal condition for an electric current that is to be applied to the fuel cell such that the fuel cell has optimal durability, based on the derived operating condition for accelerated degradation applicable to the fuel cell.

10. The method according to claim 9, wherein the deriving an optimal condition for an electric current that is to be applied to the fuel cell includes:
fixing relative humidity conditions of an anode and a cathode of the fuel cell and a temperature condition of the fuel cell, among the derived operating conditions for accelerated degradation, operating the fuel cell by applying multiple different electric currents to the fuel cell, and identifying the degree of degradation of the fuel cell under a condition for each of the multiple different electric currents, and
selecting as an optimal condition for an electric current a condition for an electric current under which the degree of degradation of the fuel cell is lowest.

* * * * *